(12) United States Patent
Sasaki

(10) Patent No.: US 7,436,340 B2
(45) Date of Patent: Oct. 14, 2008

(54) TIMING GENERATING CIRCUIT AND DIGITAL TO ANALOG CONVERTER USING THE SAME

(75) Inventor: Seiichiro Sasaki, Saitama (JP)

(73) Assignee: Oki Electric Industry Co., Ltd. (JP)

( * ) Notice: Subject to any disclaimer, the term of this patent is extended or adjusted under 35 U.S.C. 154(b) by 0 days.

(21) Appl. No.: 11/529,550

(22) Filed: Sep. 29, 2006

(65) Prior Publication Data

US 2007/0194963 A1   Aug. 23, 2007

(30) Foreign Application Priority Data

Feb. 21, 2006   (JP)   ............................. 2006-043262

(51) Int. Cl.
*H03M 1/66* (2006.01)
(52) U.S. Cl. ...................... 341/144; 341/136
(58) Field of Classification Search ............... 341/136, 341/144; 345/204
See application file for complete search history.

(56) References Cited

U.S. PATENT DOCUMENTS

| 5,689,258 | A | * | 11/1997 | Nakamura et al. | .......... 341/136 |
| 5,706,006 | A | * | 1/1998 | Hattori | .......... 341/144 |
| 5,905,452 | A | * | 5/1999 | Baek | .......... 341/136 |
| 6,452,527 | B2 | * | 9/2002 | Takeya et al. | .......... 341/144 |
| 6,633,248 | B2 | * | 10/2003 | Song | .......... 341/144 |
| 2003/0107564 | A1 | * | 6/2003 | Miyazawa | .......... 345/204 |

FOREIGN PATENT DOCUMENTS

| JP | 10-003791 | 1/1998 |
| JP | 2003-115761 | 4/2003 |

* cited by examiner

*Primary Examiner*—Jean B Jeanglaude
(74) *Attorney, Agent, or Firm*—Studebaker & Brackett PC; Donald R. Studebaker

(57) ABSTRACT

A current-cell type D/A converter using a timing generating circuit for converting a digital code to the corresponding differential voltage Vout between a first analog voltage and a second voltage includes a plural of current cells and a plural of switch-control-signal generating circuits generating each of switch-control signals being provided each of the above current cells. Each of the above current cells includes the switching NMOSs, and the constant-current sources of the NMOSs.

5 Claims, 7 Drawing Sheets

TIMING GENERATING CIRCUIT AND DIGITAL TO ANALOG CONVERTER USING THE SAME

BACKGROUND OF THE INVENTION

1. Field of the Invention

The present invention relates to a current-cell type digital-to-analog converter (hereinafter referred to as "D/A converter") for converting a digital code to the analog voltage corresponding to the digital code using a timing generating circuit, especially, a D/A converter using a timing generating circuit having a simplified circuit configuration to improve the glitch or the settling time thereof.

This application is a counterpart of Japanese application, Ser. No. 043262/2006, filed Feb. 21, 2006, the subjects matter of which is incorporated herein by reference.

2. Description of the Related Art

Conventionally, as a technology concerned, about a D/A converter for improving the glitch or the settling time thereof, there is a description of, for example, the following documents.

Patent Document 1: Japanese patent laid-open number 2003-115761 (Document D1).
Patent Document 2: Japanese patent laid-open number H10-3791 (Document D2).

FIG. 7 is a view of configuration diagram of the main parts of the conventional current-cell type D/A converter described in the Document D1.

The above mentioned current-cell type D/A converter includes a plural of current cells 10-0, 10-1, 10-2, - - - having a plural of weighted current values of $I2^0$, $I2^1$, $I2^2$, - - - , respectively. The above plural of current cells 10-, 10-1, 10-2, - - - are connected in parallel between the plus source voltage node (hereinafter referred to as "VDD") and the output line 14 and between the VDD node and the ground node (hereinafter referred to as "GND"). In FIG. 7, the plural of current cells 10-0. 10-1, 10-2, - - - are only shown. Furthermore, a driver having a couple of switch-control-signal generating circuits 20-1, 20-2 for driving the current cell 10-0 is connected to the current cell 10-0. Drivers for driving other current cells 10-1, 10-2, - - - are connected to the current cells 10-1, 10-2 - - - , respectively, as well.

For example, the current cell 10-0 includes a constant current source 11 for applying a weighed current value $I2^0$ and two p-type MOS transistors 12, 13 (hereinafter referred to as "PMOS") of a differential switch. The constant current source 11 is connected between the VDD node and a common node N11, and the PMOS 12 is connected between the above common node N11 and an output line 14, furthermore, the PMOS 13 is connected between the common node N11 and the GND. Other current cells 10-1, 10-2, - - - being not shown in the figures have the same configurations as the above-mentioned configuration. An output terminal OUT is connected to one end of the output line 14, and a resistor 15 for current-to-voltage conversion (hereinafter referred to as "I/V conversion") is connected between the above output terminal OUT and the GND.

A couple of switch-control-signal generating circuits 20-1, 20-2 drive the current cell 10-0, as mentioned before. The switch-control-signal generating circuit 20-1 is connected to an output side of an inverter 25 for inverting a signal of digital code D being inputted from an input terminal IN, and is configured to output a switch-control signal S20-1 having the predetermined timing to a gate of PMOS 12 and turn on/off the above PMOS 12. Meanwhile, the switch-control-signal generating circuit 20-2 has the same circuit configuration as the above switch-control-signal generating circuit 20-1 to output the switch-control signal S20-2 having the predetermined timing to the gate of PMOS 13, based on the signal of digital code D, and turn on/off the above PMOS 13.

The switch-control-signal generating circuit 20-2 consists of a master-side latch circuit 21, a selector 22, a slave-side latch circuit 23. The master-side latch circuit 21 is a circuit for holding the digital code signal D, synchronized with complementary latch signals LA, LAB. The master-side latch circuit 21 consists of a N-channel type MOS transistor (hereinafter referred to as "NMOS") and an inverter, and the selector 22 is connected to the output side thereof. The selector 22 is a circuit for selecting one of two delayed signals R, F corresponding to a signal latched by the latch circuit 21 and outputting the selected signal thereof. The selector 22 consists of a not-and (NAND) logic gate and an inverter, and the slave-side latch circuit 23 is connected to the output side thereof. The slave-side latch circuit 23 is a circuit for outputting the switch control signal S20-2 using the signal selected by the selector 22 and the above complementary signal and has the same circuit configuration as the master-side latch circuit 21.

In the D/A converter having the above mentioned configuration, the switch-control signals S20-1, S20-2, - - - inputted to each of the input terminal IN to control the PMOSs 12, 13, - - - for differential switches in each of the current cells 10-0, - - - are generated by the switch-control-signal generating circuits 20-1, 20-2, - - - and each of the current cells 10-0, - - - supplies currents from the constant current sources 11, - - - , to the GND side or the output line 14 side, corresponding to the switch-control signals S20-1, S20-2, - - - . Subsequently, all the currents supplied to the output line 14 side are added and converted to voltages by the resistor 15 for I/V conversion. Then, the analog voltages thereof corresponding to the digital codes D, - - - are outputted from the output terminal OUT.

Each of the current cells 10-0, - - - is configured to have a period when the switch-control signals S20-1, 20-2, - - - become low level (hereinafter referred to as "L-level") at switching timing thereof, that is, the PMOSs 12, 13, - - - are simultaneously turned on. Consequently, in each of the current cells 10-0, - - -, glitches or variations of settling time can be prevented at turning on/off timings of the PMOSs 12, 13, - - - .

SUMMARY OF THE INVENTION

In the conventional D/A converter of FIG. 7, glitches and settling times are improved by eliminating simultaneous off-states of each of the current cells 10-0 - - - by adjusting the current-switching timings of the switch-control signals S20-1, S20-2, - - - using the switch-control-signal generating circuits 20-1, 20-2, - - - , and stabilizing the voltages of the common nodes N11, - - - .

However, in the D/A converter of FIG. 7, the switch-control-signal generating circuits 20-1, 20-2, - - - become necessary for complicated timing adjustments with respect to each of the switch-control-signal lines, therefore there is a problem that circuit volume and chip area thereof increase.

To be solved the above-mentioned problem, for example, the technology described in the Document D2 can be used. In the Document D2, there is a description of the technology of configuration by doubled transistors consisting of two differential-input type transistors connected to each other in parallel in a preferred sensing amplifier of differential amplifier for semiconductor memory devices. The switch-control-signal generating circuits 20-1, 20-2, - - - can be simplified by configuring the PMOSs 12, 13, - - - of differential switches in each of the current cell 10-0, - - - by doubled PMOSs connected in parallel to each other, using the above technology. However, since the number of PMOSs being controlled increases, the circuit configuration of the switch-control-signal generating circuits 20-1, 20-2, - - - becomes complicated, consequently, it is difficult to solve the above-mentioned problem.

The present invention of the timing-generating circuit consists of a first transistor, a second transistor, a third transistor, and a forth transistor. The first transistor being formed between a first node and a second node connects electrically the above first node and the above second node in a first period. The second transistor being formed between the above first node and the above second node connects electrically between the above first node and the above second node in a second period being slightly staggered from the above first period. The third transistor being formed between the above second node and the above third node connects electrically between the above second node and the above third node in a third period being in the opposite phase to the above first period. The forth transistor being formed between the above second node and the above third node connects electrically the above second node and the above third node in a forth period being in the opposite phase to the above second period.

A current-cell type D/A converter according to the present invention converts a digital code to the corresponding differential voltage between a first analog voltage and a second analog voltage using the above-mentioned timing-generating circuit, and includes a plural of current cells and a plural of switch-control-signal generating circuits.

The above-mentioned a plural of current cells are connected in parallel between a first output line outputting the above first analog voltage and the source voltage node (for example, the VDD node or the GND, etc.) and between a second output line outputting the above second analog voltage and the source voltage node. The above plural of switch-control-signal generating circuits are formed with respect to each of the above current cells, and are circuits configured to input the above digital code and generate a first switch-control signal corresponding to the above digital code, a second switch-control signal having the opposite phase to the above first switch-control-signal, a third switch-control signal having a timing slightly staggered from the first switch-control signal, and a forth switch-control signal having a timing staggered from the above second switch-control signal, and provide the above switch-control signals with each of the above current cells.

Furthermore, each of the above current cells includes a first switch (equivalent of the first transistor of the above invention), a second switch (equivalent of the second transistor of the above invention), a first switch device (equivalent of the third transistor of the above invention), a second switch device (equivalent of the forth transistor of the above invention), and a constant current source. The first switch is connected between the above first output line and a common node and is turned on/off by the above first switch-control signal. The second switch is connected between the above second output line and the above common node and is turned on/off by the above second switch-control signal. The first switch device is connected in parallel to the above first switch and is turned on/off by the above third switch-control signal. The second switch device is connected in parallel to the above second switch and is turned on/off by the above forth switch-control signal. The constant current source is connected between the above common node and the source voltage node.

In each of the current cells having the before mentioned configurations, glitches and settling times of the D/A converter is improved by eliminating simultaneous off-states of the whole switches by adjusting switch timings of the above first and the second switches, and the above first and the second switch devices being turned on/off states by the above first, second, third, forth switch control signals, respectively.

BRIEF DESCRIPTION OF THE DRAWINGS

FIG. 6: A view of configuration diagram of a switch-control-signal generating circuit showing the third embodiment of the present invention.

FIG. 7: A view of configuration diagram of main parts of a conventional current-cell type D/A converter.

DETAILED DESCRIPTION OF THE PREFERRED EMBODIMENTS

The current-cell type D/A converter is configured to covert the digital code to the corresponding differential voltage between the first and the second analog voltages, including a plural current cells, and a plural of switch-control-signal generating circuits generating the first, second, third, forth switch-control signals given to each of the current cells, respectively. Each of the current cell includes the first and the second switches, the first and the second switch devices, and the constant current source supplying the predetermined weighed current. In the above configurations, the glitches and settling times of the D/A converter are improved by eliminating simultaneous off-states of the whole switches by adjusting switch timings of the above first and the second switches, and the above first and the second switch devices being turned on/off states by the above first, second, third, forth switch control signals, respectively.

First Embodiment

Figure 1:
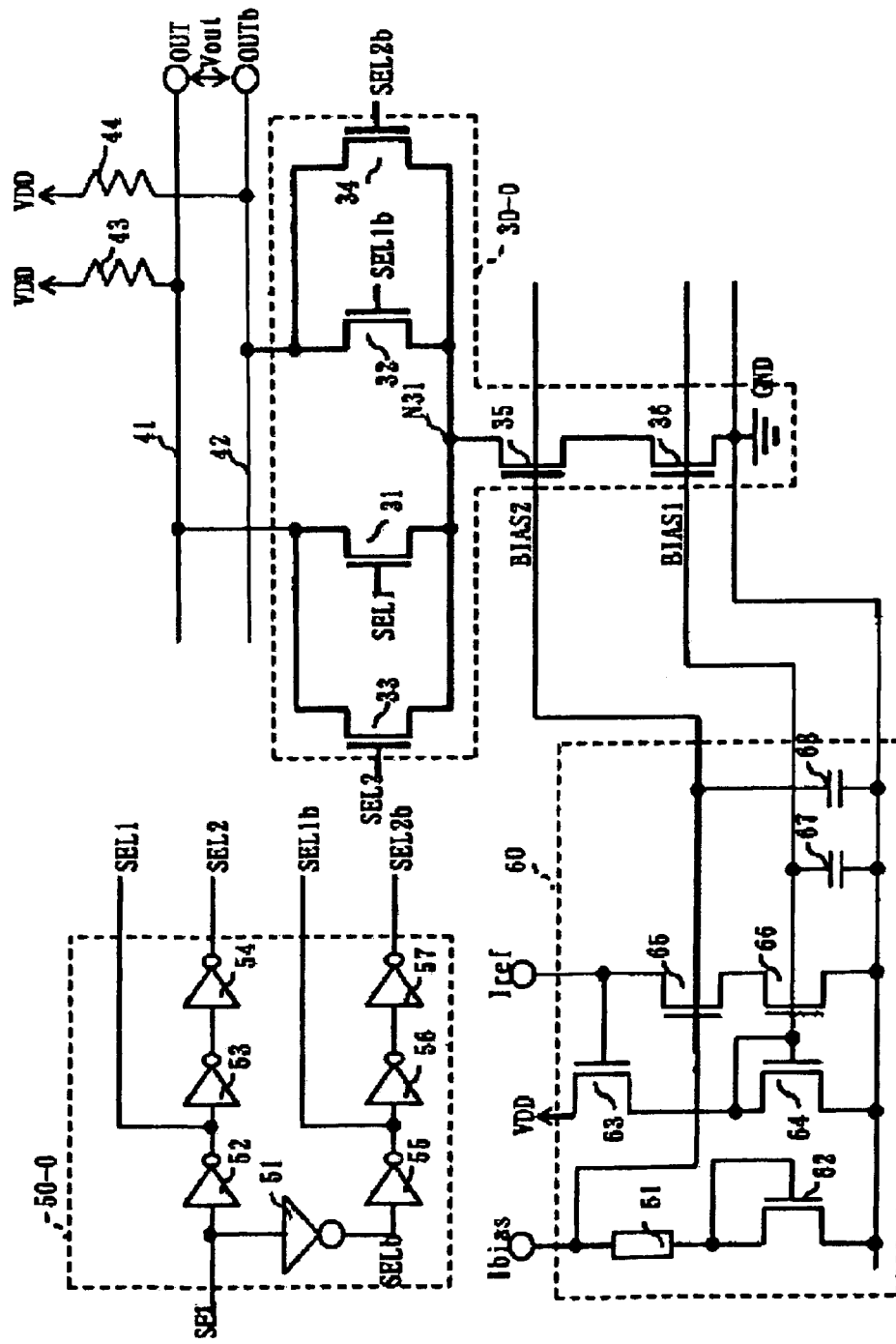
FIG. 1: A view of configuration diagram of main parts of a current-cell type D/A converter showing the first embodiment of the present invention.

Configuration of the First Embodiment:

FIG. 1 is a view of configuration diagram of main parts of a current-cell type D/A converter according to the first embodiment of the present invention.

The above mentioned current-cell type D/A converter includes a plural of current cells 30-0, - - - , for example, having weighted current values I of $I2^0$, $I2^1$, $I2^2$, - - - , respectively, and the above plural of current cells 30-0, - - - are connected in parallel between the first output line 41, the second output line 42 and the source voltage node (for example, GND). Each of switch-control-signal generating circuits 50-0, - - - is connected to each of the current cells 30-0. - - - , respectively, as the driving circuits thereof. Furthermore, a common bias circuits 60 for supplying the bias voltages BIAS1, BIAS2 to the plural of the current cells 30-0, - - - is connected to the plural of the current cells 30-0.

For example, the current cells 30-0 consists of a timing generating circuit including the first, the second, the third, the forth transistors or the first switch, the first switch device, the second switch, the second switch device (for example, NMOSs 31, 33, 32, 34), and a constant current source (for example, two serially-connected NMOSs 35, 36).

The NMOS 31 of the first switch (or the first transistor) is connected between a first output line (the first node) 41 and a common node (the second node) N31, and is turned on/off by a first switch-control-signal SEL1. The NMOS 32 of the second switch (or the third transistor) is connected between a second output line (the third node) 42 and a common node (the second node) N31, and is turned on/off by a second switch-control-signal SEL1b. The NMOS 33 of the first switch device (or the second transistor) is connected in parallel to the NMOS 31, and is turned on/off by a third switch-control-signal (for example, a first signal) SEL2. The NMOS 34 of the second switch device (or the forth transistor) is connected in parallel to the NMOS 32, and is turned on/off by a forth switch-control-signal (for example, a second signal) SEL2b. The NMOSs 35, 36 of the current sources are connected between a common node N31 and the GND, and supply the current I2$^0$ weighed by supplying the bias voltages BIAS1, BIAS2.

Other current cells not shown in the figures are connected between each of the first switch (for example, the NMOSs), the second switch (for example, the NMOSs), the first switch device (for example, one NMOS), and the second switch device (for example, one NMOS), the common node, and the GND, and each of other current cells not shown in the figures includes the constant current source (for example, serialyconnected two NMOSs) for supplying each of weighed currents of I2$^1$, I2$^2$, - - -, respectively.

Each of ends of the first output line 41 and the second output line 42 is connected to the first output terminal OUT or the second output terminal OUTb, respectively. I/V conversion devices (for example, resistors) 43, 44 are connected to between the first output terminal OUT and the VDD node, and between the second output terminal OUTb and the VDD node, respectively. Differential voltages from between the first output terminal OUT and the second output terminal OUTb are analog voltages Vout corresponding to the digital codes D, - - - of the signals SEL, - - - being inputted to input terminals I, - - - .

The switch-control-signal generating circuit 50-0 for providing the current cell 30-0 with the first, the second switch-control signals SEL1, SELb and the first, the second signals SEL2, SEL2b is configured by delay circuits consisting of inverters 51-57 for inverting and delaying signals.

The above delay circuit consists of the inverters from 51 to 57. The inverter 51 outputs the signal SELb having the opposite phase to the signal SEL by inverting the signal SEL of the digital code D from the input terminal IN. The inverter 52 outputs the first switch-control signal SEL1 by inverting the inputted signal SEL. The two-stage inverters 53, 54 are serially connected to the output side of the inverter 52 and output the first signal SEL2 by delaying the first switch-control signal SEL1. The inverter 55 outputs the second switch-control signal SEL1b by inverting the output signal SELb from the inverter 51. The two-stage inverters 56, 57 are serially connected to the output side of the inverter 55 and outputs the first signal SEL2 by delaying the first switch-control signal SEL1. The first signal SEL2 has the same phase as the first control-signal SEL1, though, the first signal SEL2 is delayed to an extent of around two inverters. Similarly, The second signal SEL2b has the same phase as the second control-signal SEL1b, though, the second signal SEL2b is delayed to an extent of around two inverters.

Other switch-control-signal generating circuits not shown in the figures outputs the first and the second switch-control signals and the first and the second signals by inverting and delaying the digital codes inputted to the input terminal, as the switch-control-signal generating circuits 50-0, and other switch-control-signal generating circuits are configured by a delay circuit consisting of six inverters.

A common bias circuit 60 for providing a plural of current cells 30-0, - - - with the bias voltages BIAS1, BIAS2 includes a resistor 61, NMOSs 62, 64 connected each other by diode, a NMOS 63 having a gate controlled by a supplied reference current Iref, NMOSs 65, 66, and capacitors 67, 68 for charging charges.

The resistor 61 and the NMOS 62 connected by a diode are serially connected between the input terminal inputting the bias current Ibias and the GND, and the bias voltage BIAS2 is outputted from the input-terminal-side electrode of the above resistor 61. The NMOS 63 having a gate controlled by the reference current Iref and the NMOS 64 connected by a diode are serially connected between the VDD node and the GND. The NMOS 65 having a gate controlled by the bias voltage BIAS2 and the NMOS 66 having a gate controlled by the drain voltage and the gate voltage of the NMOS 64 are serially connected between the input terminal inputting the bias current Ibias and the GND, and the bias voltage BIAS1 is outputted from the gate of the above NMOS 66. The capacitors 67, 68 are connected between the gates of the NMOSs 65, 66 and the GND, respectively.

Figure 2:
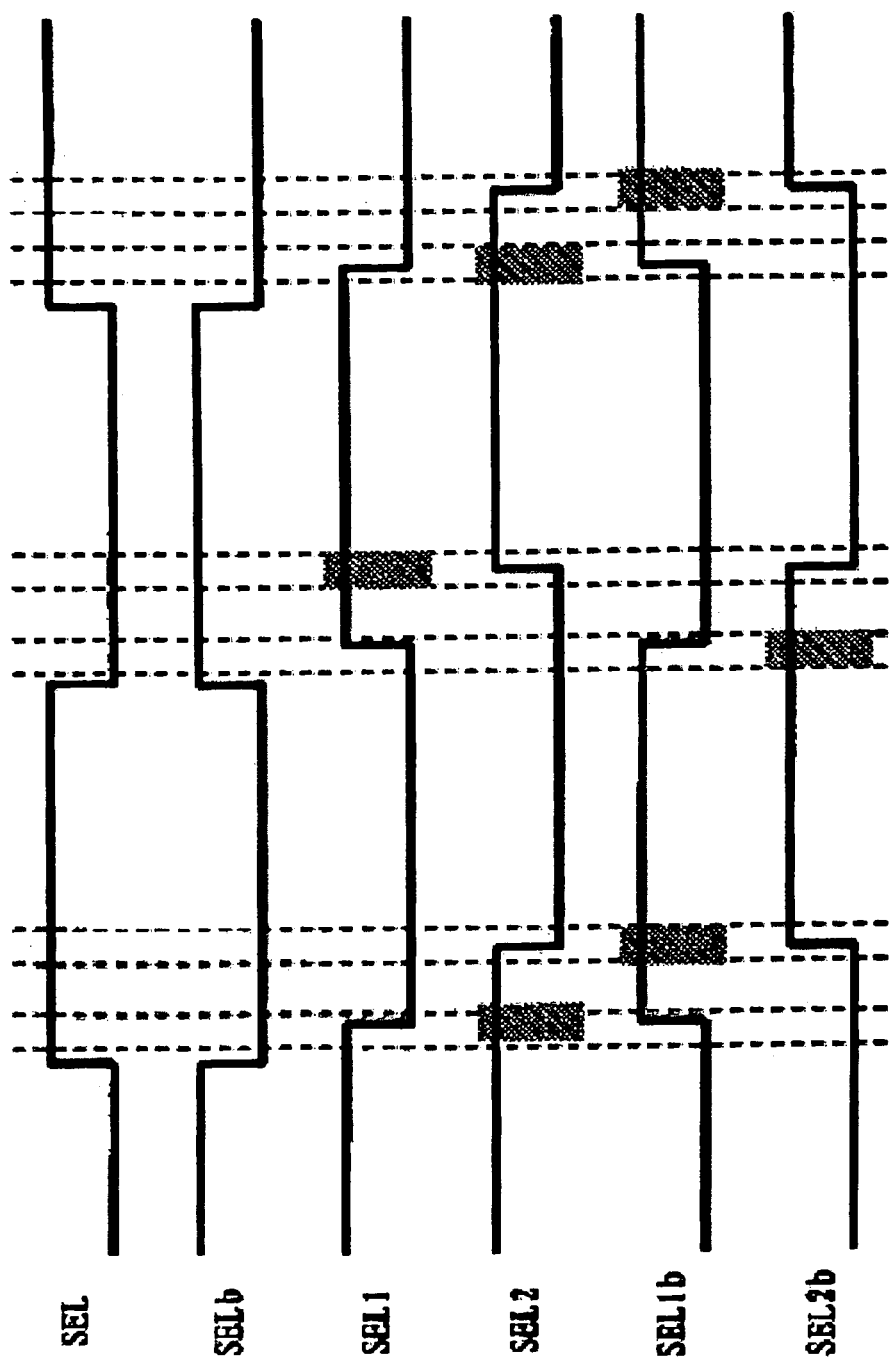
FIG. 2: A view of timing chart of the switch-control signals in FIG. 1.

Operation of the First Embodiment:

FIG. 2 is a view of a timing chart of the switch-control signals in FIG. 1. The horizontal axis represents time and the vertical axis represents logic level.

In the switch-control-signal generating circuits 50-0 - - - of the D/A converter in FIG. 1, the switch-control signals SEL1, SEL1b, - - - and the signal SEL2, SEL2b, - - - for controlling the NMOSs 31-34 - - - in each of the current cells 30-0, - - - are generated, corresponding to the signals SEL, - - - of the digital codes D, - - - being inputted in each of the input terminals IN, - - - .

When the signal SEL of the digital code D inputted to the input terminal IN rises to high logic level (hereinafter referred to as "H level") in the switch-control-signal generating circuit 50-0, for example, the above signal SEL is inverted by the inverters 51, 52 and then the signal SELb and the switch-control signal SEL1 fall to L level. When the switch-control signal SEL1 falls to L level, the NMOS31 in the current cell 30-0 becomes off-state. When the switch-control signal SELb falls to L level, the above switch-control signal SELb is inverted by the inverter 55 and the switch-control signal SEL1b rises to H level. Consequently, the NMOS 32 in the current cell 30-0 becomes on-state, and a source current flows from the output line 42 to the NMOS 32 to the common node N31 to the NMOSs 35, 36 to the GND.

When the switch-control-signal SEL1 falls to L level, the above switch-control-signal SEL is delayed by two-stage inverter of the inverters 53, 54, and the signal SEL2 falls to L level. When the switch-control-signal SEL1b rises to H level, the signal SEL2b rises to H level, the above switch-control-signal SEL is delayed by two-stage inverter of the inverters 56, 57, and the signal SEL2b rises to H level. Consequently, the NMOS 34 in the current cell 30-0 becomes on-state, and then the flow of source current through the NMOS 32 is divided to the NMOS34 and is applied to the GND through the common node N31 and the NMOSs 35, 36.

Subsequently, when the signal SEL of the digital code D inputted to the input terminal IN falls to L level, the above signal SEL is inverted by inverters 51, 52, and the signal SELb and the switch-control signal SEL1 rise to H level. When the switch-control signal SEL1 rises to H level, the NMOS 31 in the current cell 30-0 becomes on-state, the source current flows from the output line 41 to the NMOS 31 to the common node 31 to the NMOS 35, 36 to the GND. When the signal SELb rises to H level, the signal SELb is inverted by the inverters 55, and the switch-control signal SEL1b falls to L level. Consequently, the NMOS 32 in the current cell 30-0 becomes off-state, and then the current flowing through the NMOS 32 is cut off.

When the switch-control-signal SEL1 rises to H level, the above switch-control-signal SEL is delayed by two-stage inverter of the inverters 53, 54, and the signal SEL2 rises to H level. When the signal SEL2 rises to H level, the NMOS 33 in the current cell 30-0 becomes on-state, and then the flow of source current through the NMOS 31 is divided to the NMOS33 and is applied to the GND through the common node N31 and the NMOSs 35, 36. When the switch-control signal SEL1b falls to L level, the above signal SEL1b is delayed by two-stage inverter of the inverters 56, 57, and the switch-control signal SEL2b falls to L level. Consequently, the NMOS 34 in the current cell 30-0 becomes off-state, and then the current flowing through the NMOS 34 is cut off.

In each of the current cell 30-0, - - - , the whole currents flowing from the output line 41 to the GND though the common node N31 are added in the output line 41 and converted to voltage by the resistor 43 for I/V conversion. Similarly, the whole currents flowing from the output line 42 to the GND though the common node N31 are added in the output line 42 and converted to voltage by the resistor 44 for I/V conversion. And then, the differential voltage between the output terminals OUT and OUTb is outputted as the analog voltage Vout corresponding to the digital code D, - - - .

Effects of the First Embodiment:

According to the first embodiment, the flowing effects from (a) to (e).

(a) When the NMOSs 31, 32 are turned on/off, since the NMOS 33 or the NMOS 34 is in on-state, a period of zero-current can be eliminated. Therefore, the voltage variations of the common node N31 can be reduced, and the current variations of the constant current sources 35, 36 can be restrained. Consequently, the effects of reducing the glitches caused by turning on/off the switching NMOSs 31-34 and the effects of improving the settling time due to the reduced current variations of the constant current sources 35, 36 can be achieved. Additionally, since there is the configuration that the differential voltage between the output terminals OUT and the OUTb is outputted as the analog voltage Vout, the circuit characteristics between one side of the switching NMOSs 31, 33 and the other side of the switching NMOSs 32, 34 are well balanced, and the more stable analog voltage Vout can be outputted.

(b) Since the switch-control-signal generating circuit 50-0 for generating the switch-control signals SEL1,SELb, and the signals SEL2, SEL2b to switch the NMOSs 31-34 consists of simple delay circuits using the inverters 51-57, the circuit volume and the chip area thereof can be reduced.

(c) FIG. 3(A), (B) is a diagram showing the checking results of effects of the D/A converter according to the first embodiment of the present invention by simulation between the D/A converter according to the first embodiment and the conventional D/A converter. FIG. 3(A) is a view of diagram showing combination of the first embodiment results and the conventional results, and FIG. 3(B) is a view of diagram showing separation of the first embodiment results and the conventional results. The horizontal axis shows time (Time), and the vertical axis shows voltage (Voltage).

Figure 3:
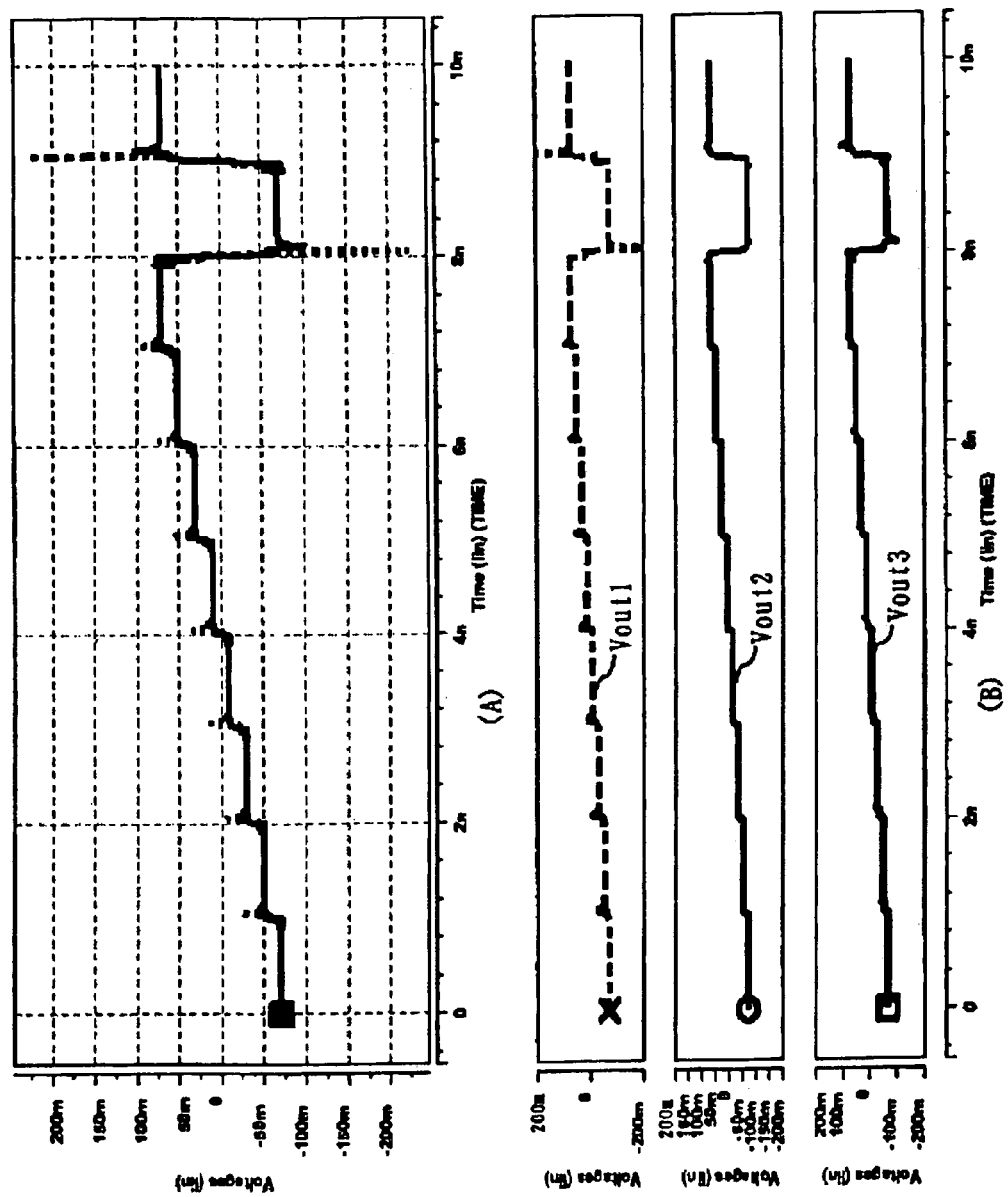
FIG. 3: A view of checking results of effects by simulation of a D/A converter according to the first embodiment and a conventional D/A converter.

In FIG. 3, the Vout curb represents a curb of the differential voltage in a D/A converter according to the first embodiment of the present invention. The Vout1 curb represents a curb of the analog voltage differential output in the case where a timing adjusting circuit such as the switch-control-signal generating circuits 20-1, 20-2 is not formed in a conventional D/A converter of FIG. 7, and the Vout2 represents a curb of the differential analog voltage output in the conventional D/A converter of FIG. 7.

As shown by the Vout curb, in the case where a timing adjusting circuit such as the switch-control-signal generating circuits 20-1, 20-2 is not formed in the conventional D/A converter of FIG. 7, a large glitch noise occurs when the switching PMOSs 12, 13 are switched simultaneously, however, the disadvantage of the Vout curb is improved to a large extent in the case where a timing adjusting circuit such as the switch-control-signal generating circuits 20-1, 20-2 is formed, as shown by the Vout2 curb. On the contrary, in the case of the D/A converter according to the first embodiment of the present invention, a large-extent glitch-reducing effect can be recognized by forming the switch-control-signal generating circuit 50-0 composed by simple delay circuit consisting of around two inverters, even if the above effect does not reaches to the extent of the effect by the circuit in the case of the conventional Vout2 curb, as shown by the Vout curb.

(d) The switch-control-signal generating 50-0 consisting of the delay circuit using inverters can be realized by using inverters included in the existing circuit in some case by only modifying interconnections without expanding the circuit volume thereof.

(e) Since the constant current source is composed by a couple of the NMOSs 35, 36, the voltage at the node between the source of NAMOS 35 and the drain of NMOS 36 is constant against the variations arising when the switching NMOSs are turned on/off, and then the stable D/A conversion can be expected. The constant current source can be composed by one NMOS or more than three NMOSs, as well.

Second Embodiment

Figure 4:
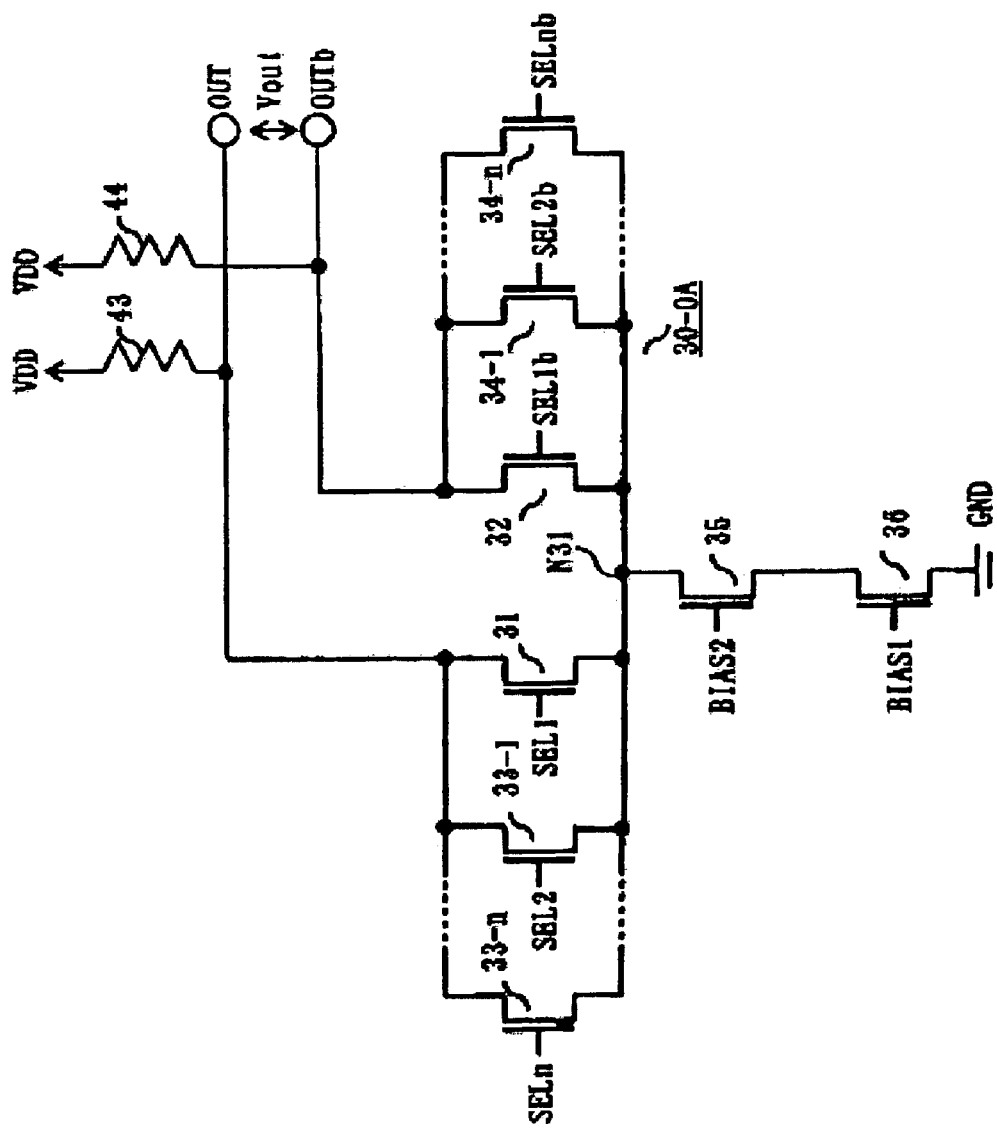
FIG. 4: A view of configuration diagram of main parts of a current-cell type D/A converter showing the second embodiment of the present invention.

Configuration of the Second Embodiment:

FIG. 4 is a view of configuration diagram of the main parts of current-cell type D/A converter according to the second embodiment of the present invention. The same numerals are given to the identical parts to ones of FIG. 1 showing the first embodiment.

In the D/A converter according to the second embodiment is composed by a current cell 30-0A having the different configuration is formed instead of the current cell 30-0 according to the first embodiment. The above current cell 30-0A is composed by a plural (n) of NMOSs from 33-1 to 33-n connected in parallel to each other, instead of one-transistor NMOS33 of the first switch device according to the first embodiment, and is composed by a plural (n) of NMOSs from 34-1 to 34-n connected in parallel to each other, instead of one-transistor NMOS34 the second switch device according to the first embodiment, as well.

Signals SEL2-SELn for turning on/off each of the NMOSs from 33-1 to 33-n have timings of the signals SEL3, - - - , SELn being staggered from the signal SEL2, and Signals SEL2b-SELnb for switching and controlling each of NMOSs from 34-1 to 34-n have timings of the signals SEL2b, - - -, SELnb being staggered from the signal SEL2b. The above signals SEL2-SELn, and SEL2b-SELnb can be generated by adding a delay circuit consisting of inverters to the switch-control-signal generating circuit 50-0 of FIG. 1. Other configurations thereof are the same as in the first embodiment.

Figure 5:
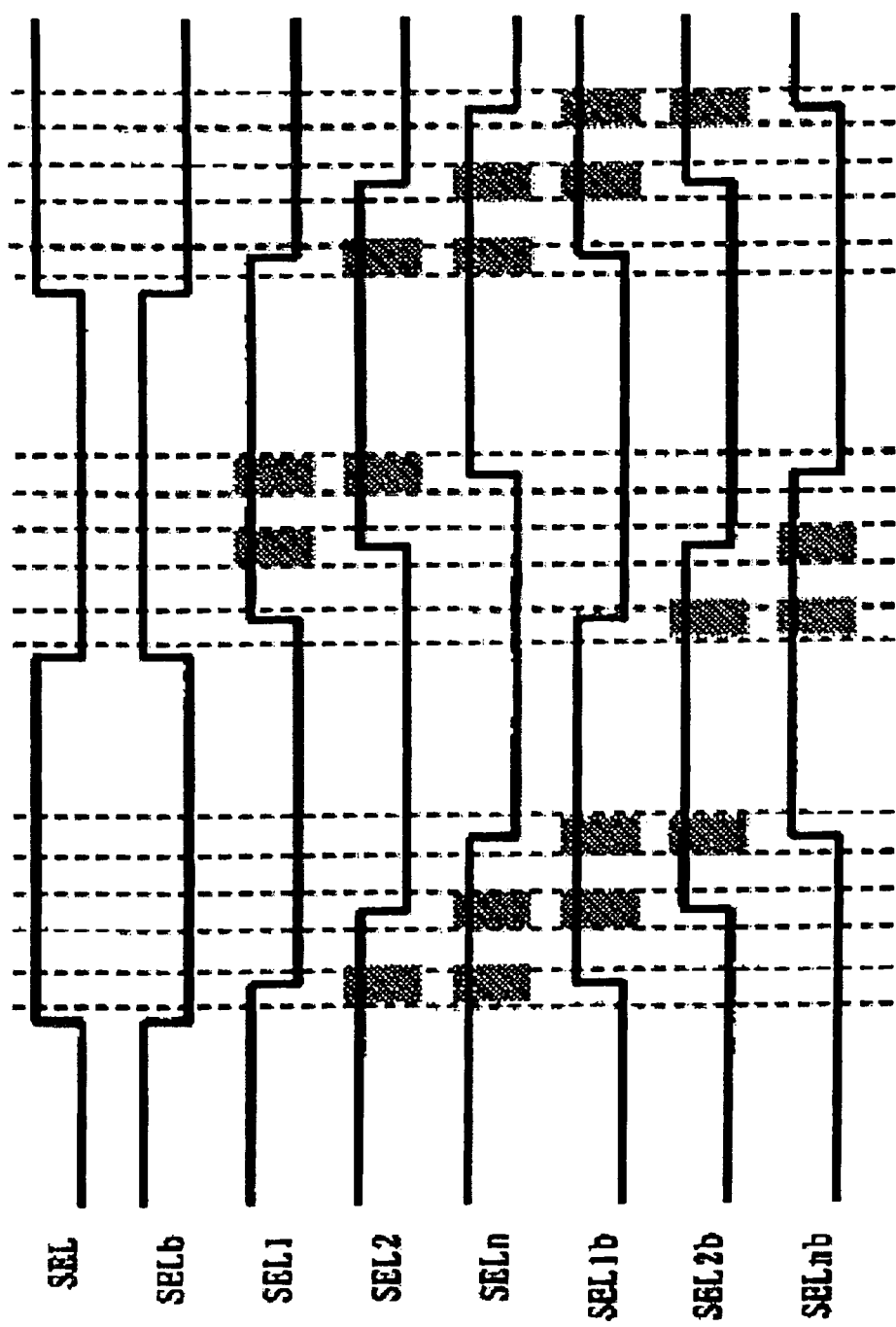
FIG. 5: A view of timing chart of the switch-control signals in FIG. 4.
Figure 9:
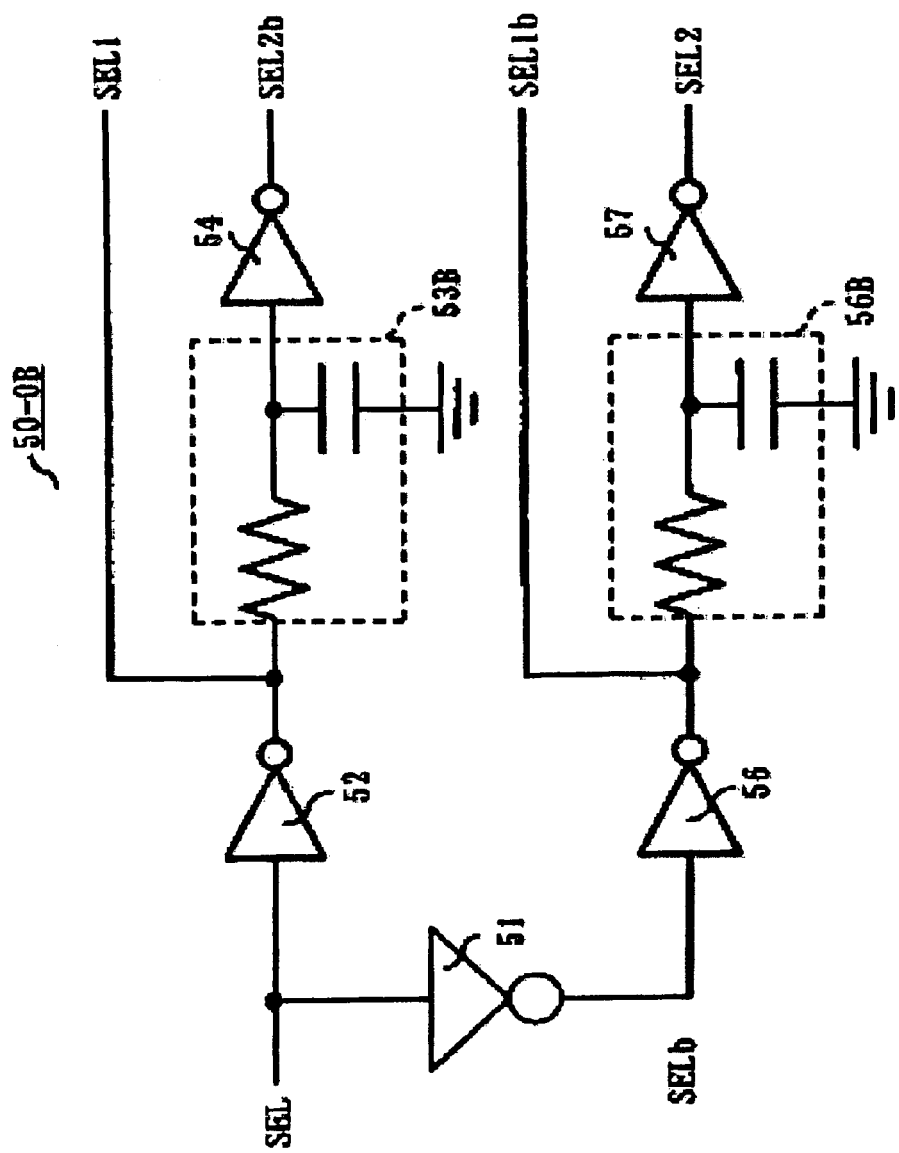
Figure 17:
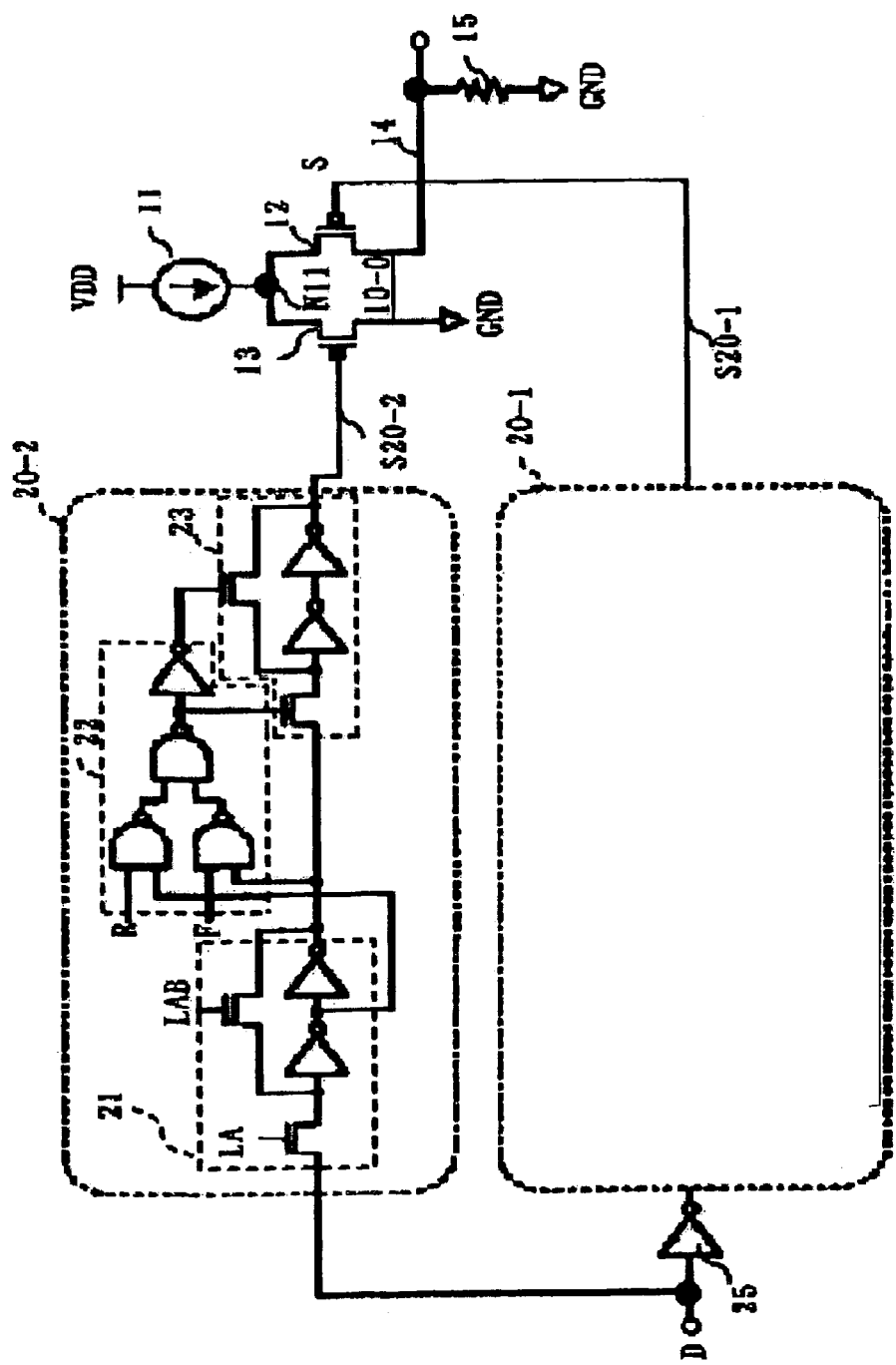

Operations of the Second Embodiment:

FIG. 5 is a view of the timing chart of switch-controlling signals of FIG. 4, and the horizontal axis represents time and the vertical axis represents logic level.

In the D/A converter of FIG. 4, when the digital code D of the signal SEL inputted to the input terminal IN of the switch-control-signal generating circuit 50-0 is turned to H level and the signal SELb having the opposite phase to the above signal SEL is turned to L level, first, the switch-control signals SEL1, SEL1b are switched, and the signals SEL2, SEL2b are switched after a delay corresponding to around two inverters. Similarly, the signals SELn, SELnb are switched after a certain delay. Consequently, the D/A conversion being approximately the same as in the first embodiment can be conducted.

Effects of the Second Embodiment:

According to the second embodiment of the present invention, there are the approximately same effects as in the first embodiment, and furthermore there are the following effects, as well.

According to the first embodiment, when one side of the switching NMOSs 31, 33 and the other side of the switching NMOSs 32, 34 are switched, since one of the above two sides, the switching NMOSs 31, 32 or the switching NMOSs 32, 34, are turned on, each of the on-resistances of the NMOSs is one-second of the resistance during on-states of the whole switches. Meanwhile, according to the second embodiment, since one side of the switching NMOSs are divided to (n+1) devices and the other side of the switching NMOSs are divided to (n+1) devices, each of the on-resistances of the NMOSs thereof can be reduced to one-(n+1)th of the on-resistance when one side of the switching NMOSs 31, 32 and the other side of the switching NMOSs 32, 34 are switched, and then the glitches thereof can be further reduced.

Third Embodiment

FIG. 6 is a view of a configuration diagram of the a switch-control-signal generating circuit showing the third embodiment, and the same numerals are given to the identical parts to ones of FIG. 1 showing the first embodiment. Even in the above configuration, the approximately same effects as in the first embodiment can be achieved, and moreover, current consumption corresponding to one inverter can be reduced.

A switch-control-signal generating circuit 50-0B according to the third embodiment of the present invention includes delay devices 53B, 56B consisting of resistors and capacitors, instead of the inverters 53, 54 in the switch-control-signal generating circuits 50-0 according to the first embodiment.

The present invention is not limited to the aforementioned first, second, third embodiments, and various modifications and various applications is possible.

(1) The current cells 30-0, 30-0A in FIG. 1 and FIG. 4 are configured by the NMOSs 31, 32, - - -, however, replacing the above NMOSs by PMOSs and replacing the VDD node by GND can ring the approximately same effects as in the first, second, third embodiment (2) The current cells 30-0, 30-0A, the switch-control-signal generating circuits 50-0, 50-0B, and the bias circuit 60 can be composed by other-types transistor than MOS-type transistor, for example, bipolar transistor, etc., or the above transistors can haste different circuit configuration.

What is claimed is:

1. A current-cell type digital-to-analog converter for converting a digital code to the corresponding differential analog voltage between a first and a second analog voltage, comprising:
    a first output line;
    a second output line;
    a plurality of current cells, each of the cells includes a first transistor, a second transistor, a third transistor and a fourth transistor, the first transistor and the second transistor are connected in parallel between the first output line and common node, and the third transistor and the fourth transistor are connected in parallel between the second output line and the common node; and
    a control circuit which outputs a first control signal, a second control signal, a third control signal and a fourth control signal, wherein the first transistor is controlled by the first control signal, the second transistor is controlled by the second control signal, the third transistor is controlled by the third control signal, and the fourth transistor is controlled by the fourth control signal,
    wherein a level of the first control signal is changed after a level of the second control signal is changed, and
    wherein a level of the third control signal is changed after a level of the fourth control signal is changed.

2. The digital-to-analog converter of claim 1, wherein the control circuit includes a plurality of delay circuits; and
    wherein the digital-to-analog converter further comprising a constant current source connected between the common node and ground and configured to supply a predetermined weighed current.

3. The digital-to-analog converter according to claim 2, wherein said delay circuits comprise-plural a plurality of inverters.

4. The digital-to-analog converter according to claim 2, wherein said delay circuits comprise inverters, resistors, and capacitors.

5. The digital-to-analog converter according to claim 4, wherein said constant current source comprises a plurality of transistors serially connected and configured to be controlled by a bias voltage.

* * * * *